US012471367B2

(12) United States Patent
Demkov et al.

(10) Patent No.: US 12,471,367 B2
(45) Date of Patent: Nov. 11, 2025

(54) SYSTEMS AND TECHNIQUES FOR FORMING SILICON-ON-OXIDE-ON-SILICON STRUCTURES

(71) Applicant: Board of Regents, The University of Texas System, Austin, TX (US)

(72) Inventors: Alexander A. Demkov, Austin, TX (US); John Elliott Ortmann, Jr., Austin, TX (US); Agham Posadas, Round Rock, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 756 days.

(21) Appl. No.: 17/436,179

(22) PCT Filed: Mar. 4, 2020

(86) PCT No.: PCT/US2020/020910
§ 371 (c)(1),
(2) Date: Sep. 3, 2021

(87) PCT Pub. No.: WO2020/180940
PCT Pub. Date: Sep. 10, 2020

(65) Prior Publication Data
US 2022/0130866 A1  Apr. 28, 2022

Related U.S. Application Data

(60) Provisional application No. 62/813,283, filed on Mar. 4, 2019.

(51) Int. Cl.
*H10D 86/00* (2025.01)
*H01L 21/762* (2006.01)

(52) U.S. Cl.
CPC ..... *H10D 86/201* (2025.01); *H01L 21/76248* (2013.01)

(58) Field of Classification Search
CPC .......... H01L 27/1203; H01L 21/76248; H01L 21/02505; H01L 21/02631;
(Continued)

(56) References Cited

U.S. PATENT DOCUMENTS 5,527,766 A * 6/1996 Eddy ...................... C04B 35/45
216/33
6,890,835 B1 * 5/2005 Chu ...................... H01L 21/2007
117/97
(Continued)

FOREIGN PATENT DOCUMENTS

CN  1068855 A  *  2/1993

OTHER PUBLICATIONS

Nano Convergence 3, Article No. 7 (2016) (Year: 2016).*
International Application No. PCT/US2020/020910, International Search Report & Written Opinion, 10 pages, Jul. 1, 2020.

Primary Examiner — Eva Y Montalvo
Assistant Examiner — Pratiksha Jayant Lohakare

(57) ABSTRACT

Some embodiments of the present technology simplify the process of producing SOI wafers significantly compared to traditional methods. Furthermore, various embodiments provide a route for the integration of perovskite transition metal oxide thin films with different properties into SOI wafers. As such films display a wide array of novel electronic, magnetic, and optical phenomena, their integration into technologically-relevant SOI wafers will likely allow for the construction of a wide array of novel devices.

30 Claims, 13 Drawing Sheets

(58) Field of Classification Search
CPC ......... H01L 21/02488; H01L 21/02381; H01L 21/02532; H01L 21/02658; H01L 21/7624; G02B 6/131
See application file for complete search history.

(56) References Cited

U.S. PATENT DOCUMENTS

| | | | |
|---|---|---|---|
| 9,299,837 B2* | 3/2016 | Cheng | H10D 30/798 |
| 10,075,143 B2* | 9/2018 | Pelzel | H10D 30/47 |
| 10,460,983 B2* | 10/2019 | Wakabayashi | H01L 21/30625 |
| 2002/0146888 A1* | 10/2002 | Ryu | H01L 21/02532 |
| | | | 257/E29.267 |
| 2005/0035345 A1* | 2/2005 | Lin | H10D 64/685 |
| | | | 257/20 |
| 2005/0104067 A1* | 5/2005 | Chu | H01L 21/76256 |
| | | | 257/66 |
| 2007/0087506 A1* | 4/2007 | Thakur | H01L 21/31675 |
| | | | 438/257 |
| 2009/0011575 A1 | 1/2009 | Shimomura et al. | |
| 2014/0273412 A1* | 9/2014 | Wu | H01L 21/0206 |
| | | | 438/478 |
| 2014/0346587 A1* | 11/2014 | Cheng | H01L 29/66636 |
| | | | 257/327 |
| 2017/0141750 A1* | 5/2017 | Pelzel | H03H 3/08 |
| 2019/0028081 A1* | 1/2019 | Pelzel | H03H 3/08 |
| 2020/0006385 A1* | 1/2020 | Cheng | H01L 21/02667 |

* cited by examiner

SYSTEMS AND TECHNIQUES FOR FORMING SILICON-ON-OXIDE-ON-SILICON STRUCTURES

CROSS-REFERENCE TO RELATED APPLICATIONS

This application is a national stage of International Patent Application No. PCT/US2020/020910 filed on Mar. 4, 2020; which claims priority to U.S. Provisional Application No. 62/813,283 filed Mar. 4, 2019, each of which is incorporated herein by reference in its entirety for all purposes.

FEDERALLY FUNDED RESEARCH

The invention was made with government support under Grant no. FA9550-12-1-0494 awarded by the Air Force Office of Scientific Research. The government has certain rights in the invention.

TECHNICAL FIELD

Various embodiments of the present technology generally relate to semiconductor manufacturing. More specifically, some embodiments of the present technology relate to epitaxial integration of a device silicon layer on an insulating oxide (e.g., $LaAlO_3$), which is itself epitaxially integrated on a silicon (001) substrate.

BACKGROUND

Silicon-on-insulator (SOI) wafers are ubiquitous in the semiconductor industry, finding use in a wide variety of integrated circuits and devices. Traditional SOI platforms feature a thin device silicon layer attached on top of a buried oxide (BOX) $SiO_2$ layer. Fabrication of such SOI wafers relies on complicated, energy intensive processes, such as the separation by implantation of oxygen (SIMOX) or wafer bonding. Additionally, these processes are limited in their applicability to materials other than silicon, excluding the use of BOX materials other than $SiO_2$.

SUMMARY

Various embodiments of the present technology generally relate to semiconductor manufacturing. More specifically, some embodiments of the present technology relate to epitaxial integration of a device silicon layer on insulating $LaAlO_3$, which is itself epitaxially integrated on a silicon (001) substrate.

Various embodiments of the present technology provide an epitaxial integration of a device silicon layer on insulating $LaAlO_3$, which is itself epitaxially integrated on a silicon (001) substrate by means of a thin $SrTiO_3$ buffer layer. Some embodiments provide for a novel SOI system prepared by direct thin film deposition techniques rather than complex implantation and wafer bonding processes. Additionally, some embodiments allow for the incorporation of BOX materials other than $SiO_2$ into the SOI wafer.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

Figure 1:
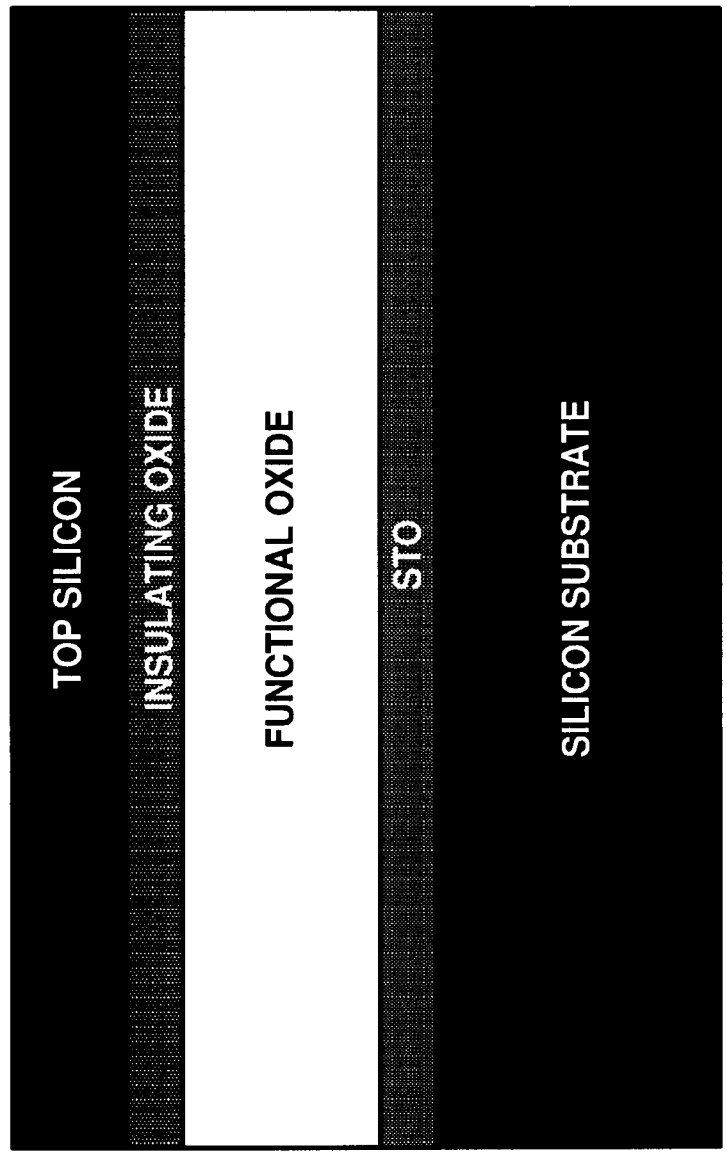
FIG. 1 illustrates a cross-sectional schematic of silicon-on-insulator-on-silicon (SOS) platform.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Systems and methods are described for epitaxial integration of a device silicon layer on insulating LaAlO$_3$ (LAO), which is itself epitaxially integrated on a silicon (001) substrate by means of an oxide buffer layer. Some embodiments provide a route to integrate crystalline silicon, including that which is grown epitaxially, on an insulating oxide (e.g., LAO) with a silicon (001) substrate. Some embodiments can produce samples with the following layer stack: silicon (001) substrate/thin film SrTiO$_3$ (STO; buffer layer)/thin film functional oxide (e.g., BaTiO$_3$; buried oxide)/thin film LAO (oxygen scavenging barrier; insulating oxide)/epitaxial top silicon (FIG. 1). Such a materials system is likely to find use in a wide variety of microelectronic and optoelectronic circuits and devices, including in next-generation metal-oxide-semiconductor field effect transistors (MOSFETs) and integrated photonics. This also opens the possibility of going beyond planar devices and allowing for vertical or 3D integration (FIG. 2), vastly increasing device density.

The layer stack presented in various embodiments of the present technology has not previously been prepared. In standard silicon-on-insulator (SOI) wafers, a so-called "device layer" of silicon is attached to an insulating amorphous SiO$_2$ layer, which is itself grown on a separate silicon wafer. In the final structure, the SiO$_2$ is referred to as the buried oxide, or BOX layer. SOI wafers are typically prepared via the separation by implantation of oxygen (SIMOX) process or using wafer bonding techniques. In contrast, various embodiments of the present technology allow for the direct epitaxial deposition of a device silicon layer on the insulating oxide LAO, which can itself be epitaxially deposited on a silicon (001) substrate via a thin STO seed layer. A wide variety of functional oxides can be epitaxially deposited atop the STO seed layer. The resulting layer stack is a novel form of SOI wafer, where the STO serves as a seed layer facilitating the epitaxial growth of oxides on a silicon substrate, the functional oxide or oxides serve as the BOX layer, and the LAO serves as an oxygen scavenging barrier between the deposited device silicon and the underlying functional oxide(s). Accordingly, various embodiments allow for SOI wafers to be prepared via direct deposition techniques rather than with the more energy intensive ion implantation and wafer bonding processes used in traditional SOI manufacturing.

Moreover, various embodiments greatly simplify the process of producing SOI wafers by relying on straight-forward thin film deposition methods rather than complicated and energy intensive processes such as SIMOX or wafer bonding. Furthermore, some embodiments open the possibility of integrating a wide array of perovskite transition metal oxide thin films into novel SOI wafers. As perovskite transition metal oxides display a remarkable array of correlated electronic, magnetic and optical phenomena, the integration of such oxide thin films into SOI wafers, especially as a 3D stack, opens the door to the creation and demonstration of a plethora of novel devices (e.g., microelectronic and photonic devices).

Some embodiments rely upon a simple integration process for the fabrication of SOI wafers as compared to the complex processes currently used. Furthermore, due to the epitaxial compatibility of many perovskite transition metal oxides with one another, our layer stack allows for the integration of a wide variety of oxide materials with a wide variety of electronic, magnetic, and optical properties into SOI wafers, as opposed to current SOI wafers which exclusively use amorphous SiO$_2$ for the BOX layer.

The formation of a smooth surface in the device silicon layer as-deposited is challenging due to the energetics of the LAO/silicon interface. This challenge can be overcome through a variety of methods. One method is through the inclusion of a suitable wetting layer or surfactant at the LAO/silicon interface. Another method is by employing a two-step growth process of the device silicon layer, in which an initial layer is deposited at high temperature for nucleation, followed by additional deposition at lower temperature. Such a deposition method results in the progressive smoothening of the device silicon surface. Finally, post-deposition methods can also be used to smoothen the device silicon layer surface, such as chemical-mechanical planarization.

Various embodiments of the present technology open the door for a multitude of new use cases that have not yet been considered. The epitaxial integration of a device silicon layer in close proximity to highly-correlated perovskite transition metal oxide thin films should allow for the construction of a wide range of novel devices relying on the electronic, magnetic and optical properties of transition metal oxide thin films. Potential examples include uses in silicon photonics platforms, non-volatile ferroelectric field-effect transistors, superconducting devices, and sensor technology.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The phrases "in some embodiments," "according to some embodiments," "in the embodiments shown," "in other embodiments," and the like generally mean the particular feature, structure, or characteristic following the phrase is included in at least one implementation of the present technology and may be included in more than one implementation. In addition, such phrases do not necessarily refer to the same embodiments or different embodiments.

Deposition of STO on Si According to the Motorola Process.

To deposit STO on silicon (001) various embodiments of the present technology use a variant of the MBE process developed over a decade ago at Motorola. For example, epi-grade prime silicon (001) wafers can be cleaned ultrasonically with acetone, isopropanol, and de-ionized water. The samples can then be exposed to ultraviolet (UV)-ozone for a period of time (e.g., 15 min) to remove residual carbon contamination. After cleaning, the samples can be introduced into the MBE growth chamber and outgassed (e.g., at 675° C. for 15 min) prior to growth. The native SiO$_2$ layer is desorbed using a variation of the Sr-assisted de-oxidation process also developed by Motorola, allowing the SiO$_2$ desorption to occur at a reduced temperature.

Figure 3:
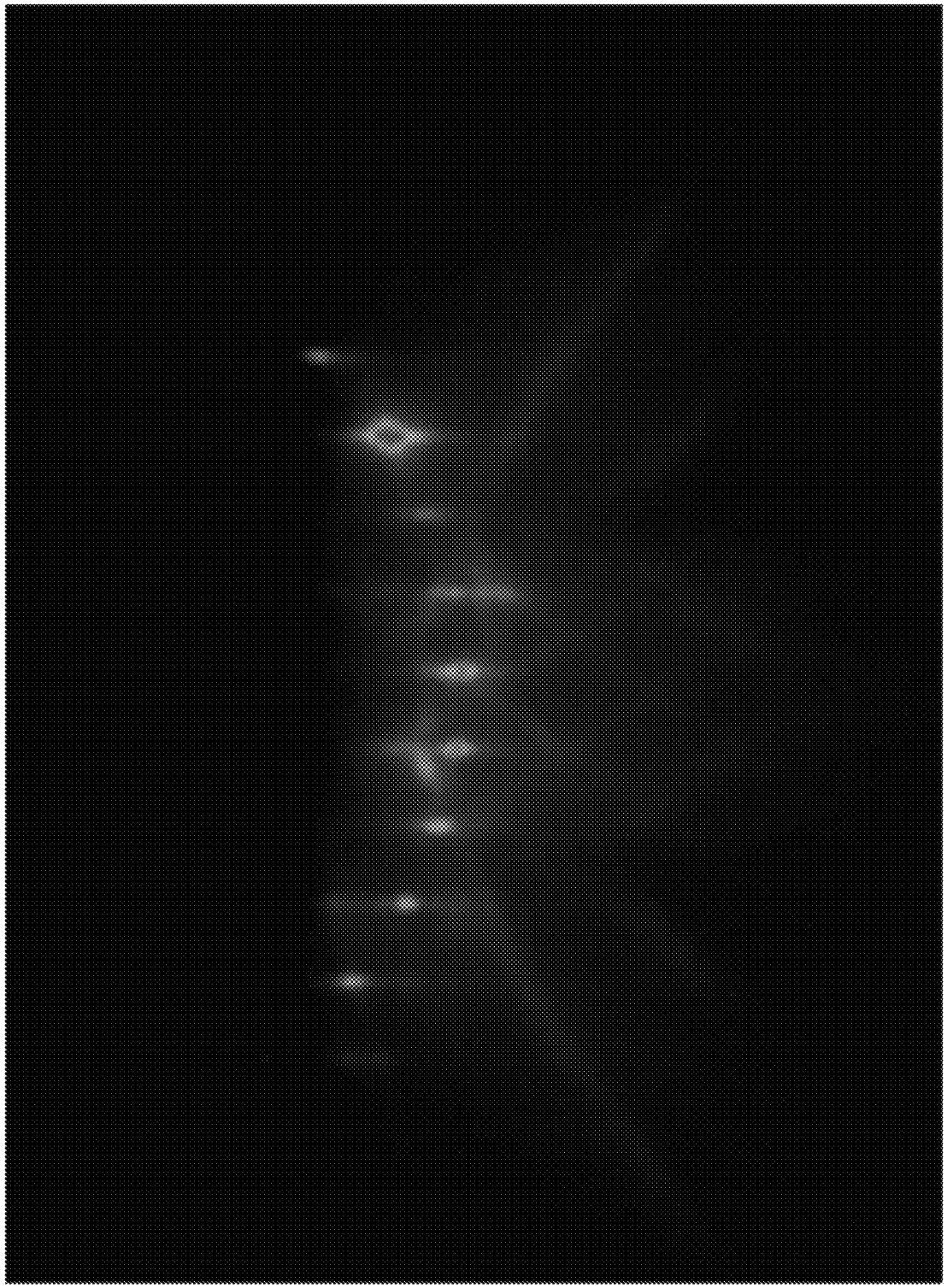
FIG. 3 illustrates a 2×1 RHEED pattern of Si(001) covered by ½ ML Sr to form a template, viewed from the Si (110) azimuth.

After removal of the native oxide as confirmed by a 2×1 RHEED pattern, the substrate temperature is reduced to 575° C. During the cooling, the RHEED pattern changes to 3×2 indicating sub-monolayer Sr coverage. Additional Sr can then be deposited until the 2×1 pattern is recovered, which corresponds to a clean Si surface covered with 0.5 monolayer (ML) of Sr (FIG. 3). This is followed by STO growth via co-deposition of Sr and Ti at 200° C. in an oxygen environment of $8 \times 10^{-8}$ Torr. After the growth of 1.5 unit cells of STO, the oxygen partial pressure can be quickly increased from $8 \times 10^{-8}$ Torr to $7 \times 10^{-7}$ Torr as an additional 2.5 unit cells are deposited. The 4-unit cell film is then annealed at 525° C. without oxygen for 5 min to fully crystallize the thin STO layer. Additional unit cells of STO are deposited at 550° C. in an oxygen atmosphere of $4 \times 10^{-7}$ Torr.

Si Cleaning and De-Ox, According to Motorola Process.

Sr can volatilize the native oxide on silicon (001) thus leading to its desorption. In addition, the Sr template protects Si from oxidation at moderate temperatures and oxygen pressures. A density functional theory model of the oxidation of the Si surface passivated by ½ ML of Sr reveals that the surface is protected for up to five adsorbed O atoms (⅚ coverage) (see, e.g., Fredrickson et al., *Journal of Applied Physics* 120, 065301 (2016) which is hereby incorporated by reference for all purposes). This is in contrast to the bare Si surface, where the first two O atoms are adsorbed at a bridging site in the Si dimer and then in its associated back-bond. With Sr present, the O atom first decorates the dimers until two O atoms are on the same dimer, and then the next O atom oxidizes the dimer bond. Crucially, the next O atom does not lead to an O back-bond, and so vertical formation of $SiO_2$ does not occur. This is in good agreement with experimental observation that the Sr passivation layer inhibits the formation of $SiO_2$.

In accordance with various embodiments, on the ¼ ML Sr surface, Sr preferentially protects one dimer, with O attracted to this dimer. The subsequent adsorption of additional O atoms onto an unprotected dimer causes the Sr to migrate to the new dimer and protect it instead. This explains the ability of the ¼ ML Sr to protect the Si surface from oxidation. Thus, either ½ ML or ¼ ML of Sr protects the Si surface by preferential O adsorption on the Sr-protected dimer's decorating and bridging sites, which do not lead to back-bond adsorption and $SiO_2$ formation.

The Atomic Structure of the Si/STO Interface is Well Established.

Figure 4A:
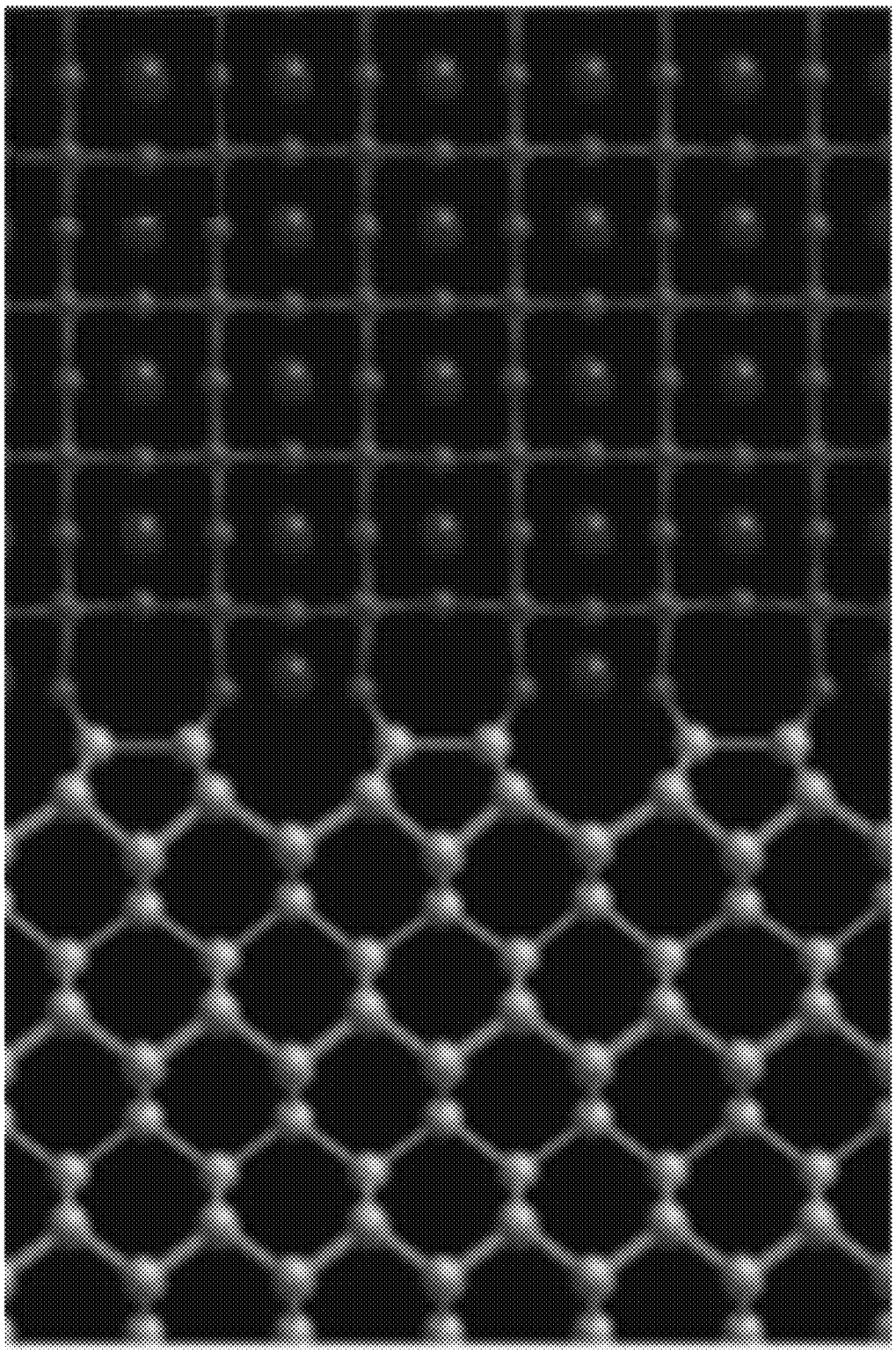
FIG. 4A illustrates a 2×1 structure of the Si-STO interface with a ½ ML of Sr at the interface.
Figure 4B:
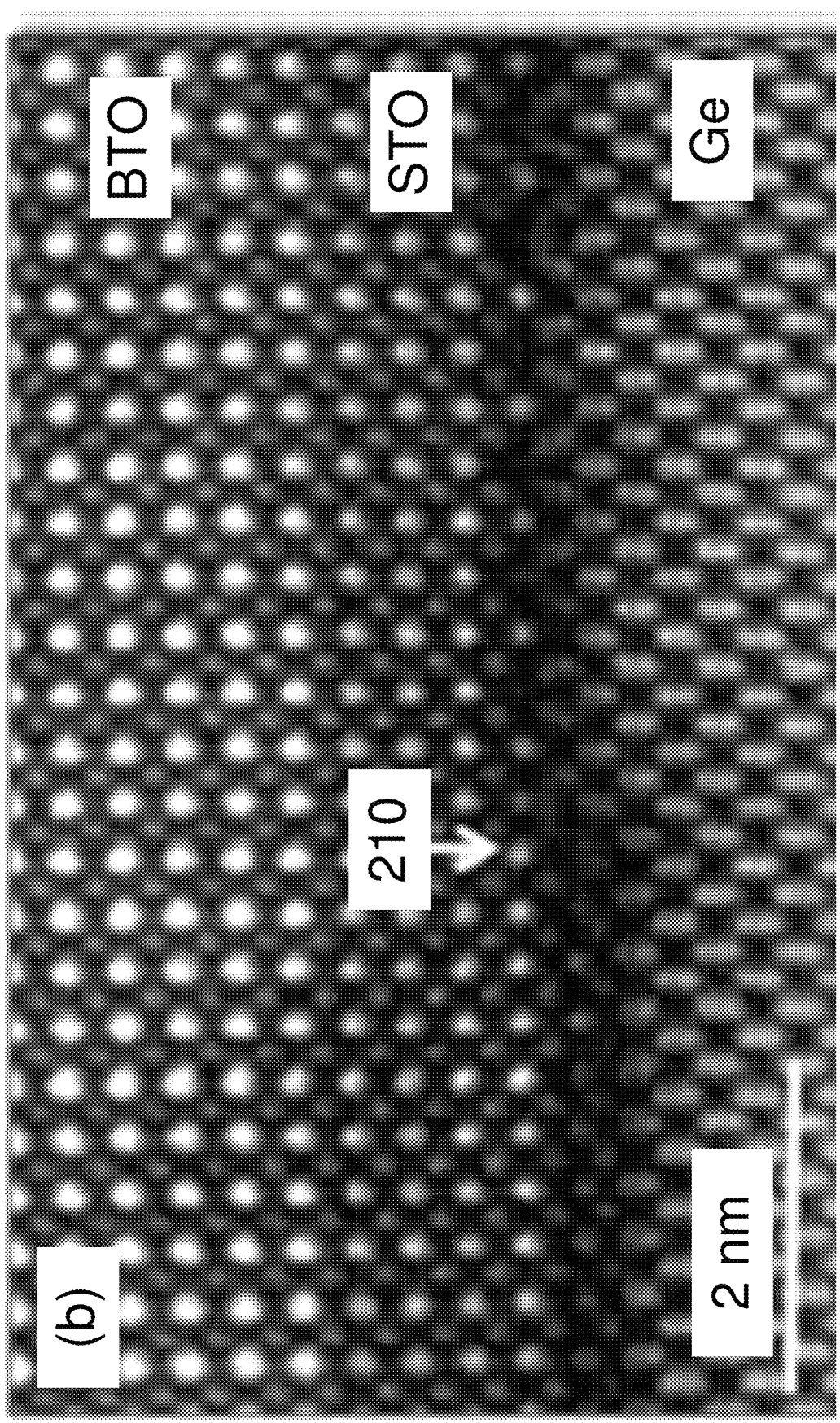
FIG. 4B is an enlarged HAADF image from the defect-free region of the BTO/STO/Ge heterostructure showing the Ge surface step (arrowed) between 2× and 1× periodicities.

Though there are still some open questions about the integration of STO on silicon (001), such as the accommodation of silicon surface step edges across the interface, the overall atomic structure of the interface is reasonably well understood for perovskites integrated on silicon and germanium. This understanding comes primarily from two sources, ab-initio calculations and Z-contrast scanning tunneling electron microscopy (STEM). The dimer structure of the (2×1)-reconstructed semiconductor surface is mostly intact when half a monolayer of alkaline earth such as Sr is added, with a Zintl $SrM_2$ (M=Si or Ge) template formed as clearly seen in FIGS. 4A-4B. In particular, FIG. 4A illustrates a 2×1 structure of the Si-STO interface with a ½ ML of Sr at the interface. FIG. 4B is an enlarged HAADF image from the defect-free region of the BTO/STO/Ge heterostructure showing the Ge surface step (arrow 210) between 2× and 1× periodicities.

LAO/STO Deposition

The LAO/STO materials system has been heavily-studied owing to the discovery of an emergent two-dimensional electron gas at the interface of these two insulating oxides. As such, fabrication of LAO/STO heterostructures has been demonstrated with many deposition techniques including molecular beam epitaxy, pulsed laser deposition and rf magnetron sputtering. The two oxides are reasonably well lattice matched, with the main control issue being oxide stoichiometry, as quantified by the La/Al or Sr/Ti ratio. Despite significant structural distortions present at the LAO/STO interfaces, a recent report has even demonstrated the high-quality fabrication of arbitrarily thick LAO/STO superlattices grown by MBE. Therefore, with the growth of LAO/STO heterostructures firmly established in the literature, the integration of such heterostructures with silicon (001) is now discussed.

LAO/STO/Si Deposition

Attempts at growing LAO directly on Si using high temperature deposition methods results in rapid interface reactions yielding amorphous films. Performing the deposition at low temperature prevents the interfacial reaction but produces an amorphous LAO film. Because LAO grows well on STO and STO can be grown epitaxially directly on Si, the growth of LAO on STO/Si has been studied by several groups. However, these still produce a silicate layer between the thin STO layer and the Si substrate after the LAO deposition because of the higher temperature needed to crystallize LAO film. A process for growing LAO on STO/Si consisting of only 2.5 unit cells of STO with clean interfaces is described in J. W. Reiner, et al., J. Appl. Phys. 105, 124501 (2009) which is hereby incorporated by reference in its entirety for all purposes.

Two unit cells of amorphous LAO are deposited at 400° C. at a pressure of $\sim 10^{-8}$ mbar and then heated to 700° C. under the same oxygen environment to crystallize the LAO seed layer. The oxygen pressure is then increased to $\sim 10^{-7}$ mbar and La and Al are co-deposited with the pressure slowly ramped to $\sim 10^{-8}$ mbar over the course of 5 minutes. LAO films up to 120 nm thick have been grown with clean interfaces using this process.

Oxygen Scavenging (Posadas)

The surface reactivity of the STO surface, which is a widely used substrate for the growth of other functional oxide thin films has been explored in A. Posadas, et al., "Scavenging of oxygen from SrTiO3 during oxide thin film deposition and the formation of interfacial 2DEGs," J. Appl. Phys. 121, 105302 (2017) which is hereby incorporated by reference in its entirety for all purposes. Various embodiments use the idea that the reactivity of the substrate with the deposited film material, particularly with regard to redox reactions, is very important. By depositing a variety of metals (Ti, Al, Nb, Pt, Eu, and Sr) and measuring the in situ core level spectra of both the metal and STO, three distinct types of behavior in thin metal films on STO (100) were demonstrated depending on the oxide formation energy and work function of the deposited metal. In many cases, there will be an interfacial layer of oxygen-deficient STO formed at the interface with the deposited metal-oxide film. This ability of STO to easily part with oxygen, combined with the large oxygen affinity of the silicon surface, clearly makes STO an unsuitable substrate for the direct deposition of silicon. It is the kinetics of scavenging, not thermodynamics that control the process of interface formation between STO and a deposited metal such as silicon.

Thus, the understanding of the oxygen scavenging process from STO suggests a general strategy of depositing silicon on crystalline oxides. The oxide materials on which crystalline silicon can be deposited must have a large affinity for oxygen, which comes with the additional benefit of being wide band gap materials. One example of such a material is the perovskite LAO. LAO has a pseudo-cubic structure and, with the usual 45° rotation, is a decent lattice match for silicon epitaxy. Indeed, such growth has been attempted with a certain level of success.

Epitaxial Deposition of Si on LAO (001)

Previously, silicon was grown on LAO single crystals (see, e.g., D. O. Klenov, et al., "The Interface between Single Crystalline (001) LaAlO3 and (001) Silicon," Jap. J. of Appl. Phys. 44, L 617 (2005) which is hereby incorporated herein in its entirety for all purposes). Substrates were commercial (001) LAO single crystals with their backsides coated with 2000 Å of Ti to ensure uniform heating in the ultra-high vacuum environment of the MBE system. Samples were boiled for 15 min in de-ionized water and blown dry with $N_2$ prior to introduction into the ultra-high vacuum environment. The base pressure of the MBE system (DCA Instruments, Inc.) was less than $1.2 \times 10^{-8}$ Torr with both the electron-beam-heated silicon source and the substrate hot. The substrate was heated in vacuum to temperatures between 800 and 950° C. for deposition and exposed to a silicon flux for 20 min, resulting in ~170 nm thick films.

Figure 5:
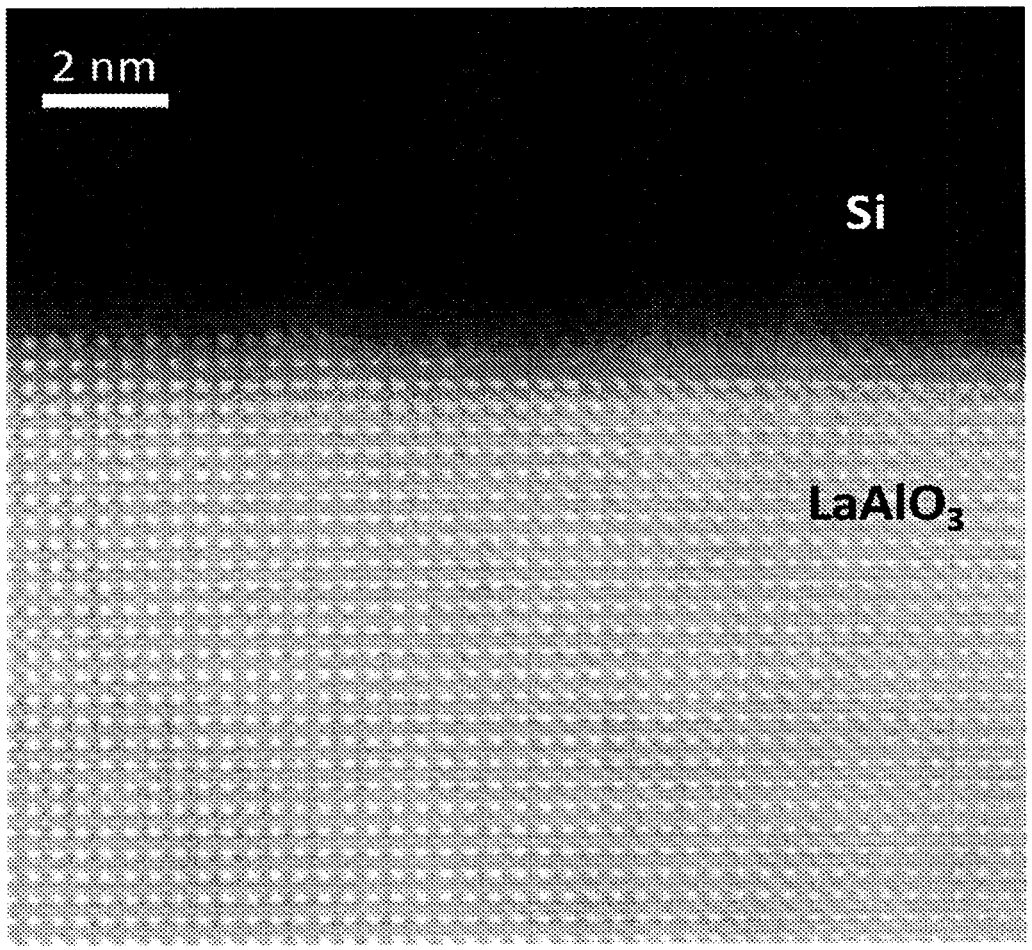
FIG. 5 illustrates HRTEM micrograph of the $LaAlO_3$/Si interface (grown at 850° C. and annealed at 900° C.) along $LaAlO_3$ where the black arrow indicates a twin in the Si film and the white arrows indicate regions along the interface that show periodic contrast changes.

In situ RHEED showed a three-dimensional island (Volmer-Weber) growth mode. After growth, the films were cooled in vacuum. Selected samples were annealed in $N_2$ for 20 s at 900, 950 and 1025° C. FIG. 5 shows a high-resolution TEM (HRTEM) image. Clearly, the authors encountered the problem of wetting, as indicated by the observation of three-dimensional island formation mentioned in the text.

Si on LAO on STO on Si (001)

Figure 6A:
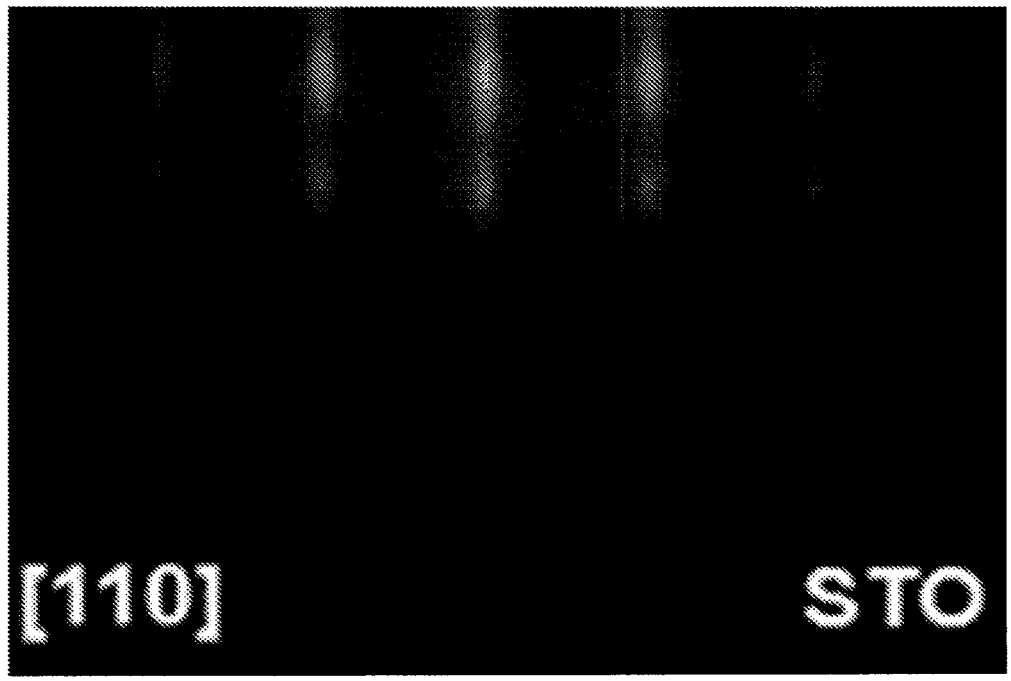
FIG. 6A is the RHEED pattern from ten unit cells of STO deposited on Si(001) surface, taken along the STO [110] direction.
Figure 6B:
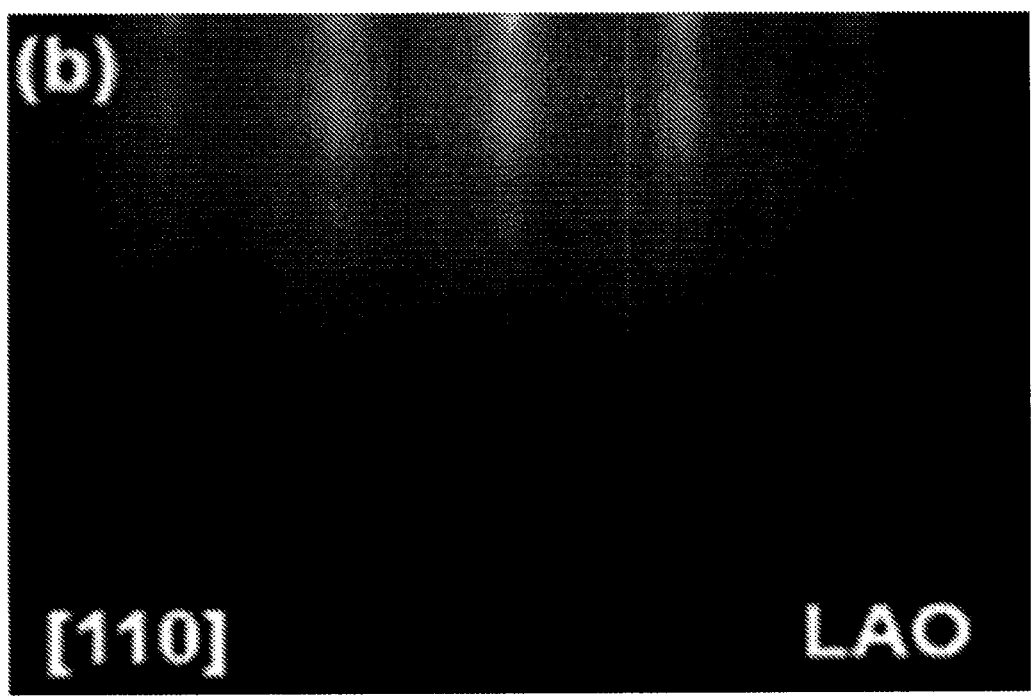
FIG. 6B is the RHEED pattern from 50 unit cells of LAO deposited on STO(001) surface, taken along the LAO [110] direction.

Various embodiments allow for sample fabrication by performing the Sr-assisted Si de-oxidation process described above. Successful de-oxidation can be confirmed by the observation of the 2×1 reconstructed silicon (001) surface in RHEED. Then, an STO template (e.g., a five unit cell STO template) can be deposited according to the Motorola process described above. After recrystallization of the STO template, an additional five unit cells of STO are deposited at 600° C. in an oxygen partial pressure of $5 \times 10^{-7}$ Torr, resulting in ten unit cells of crystalline STO on silicon (001). When the STO growth has been completed, the substrate temperature can be increased to 750° C. and the oxygen partial pressure is ramped at the same time to $1 \times 10^{-6}$ Torr for the LAO deposition. Fifty-unit cells of LAO are deposited atop the STO (001) surface. Crystallinity of the deposited STO and LAO layers is confirmed in situ using RHEED (FIGS. 6A-6B).

Si deposition atop the fifty-unit cell LAO film proceeds according to a two-step process. First, the sample temperature is increased to 875° C. in ultra-high vacuum (pressure $\sim 1 \times 10^{-8}$ Torr) and Si is deposited on the LAO surface using e-beam evaporation. When enough Si has been deposited such that the LAO film is completely buried beneath the Si film, the Si deposition is temporarily halted as the substrate temperature is reduced to 600° C. The Si deposition is resumed when the sample temperature reaches 600° C. All subsequent Si deposition occurs at 600° C. A similar process, entailing an initial high-temperature deposition followed by a subsequent low-temperature deposition, has been demonstrated for the epitaxial deposition of Ge on the insulating oxide $SrHfO_3$ (see e.g., Seo et al., Microelectronic Eng. 84, 2328 (2007) which is hereby incorporated herein by reference in its entirety for all purposes).

Figure 7:
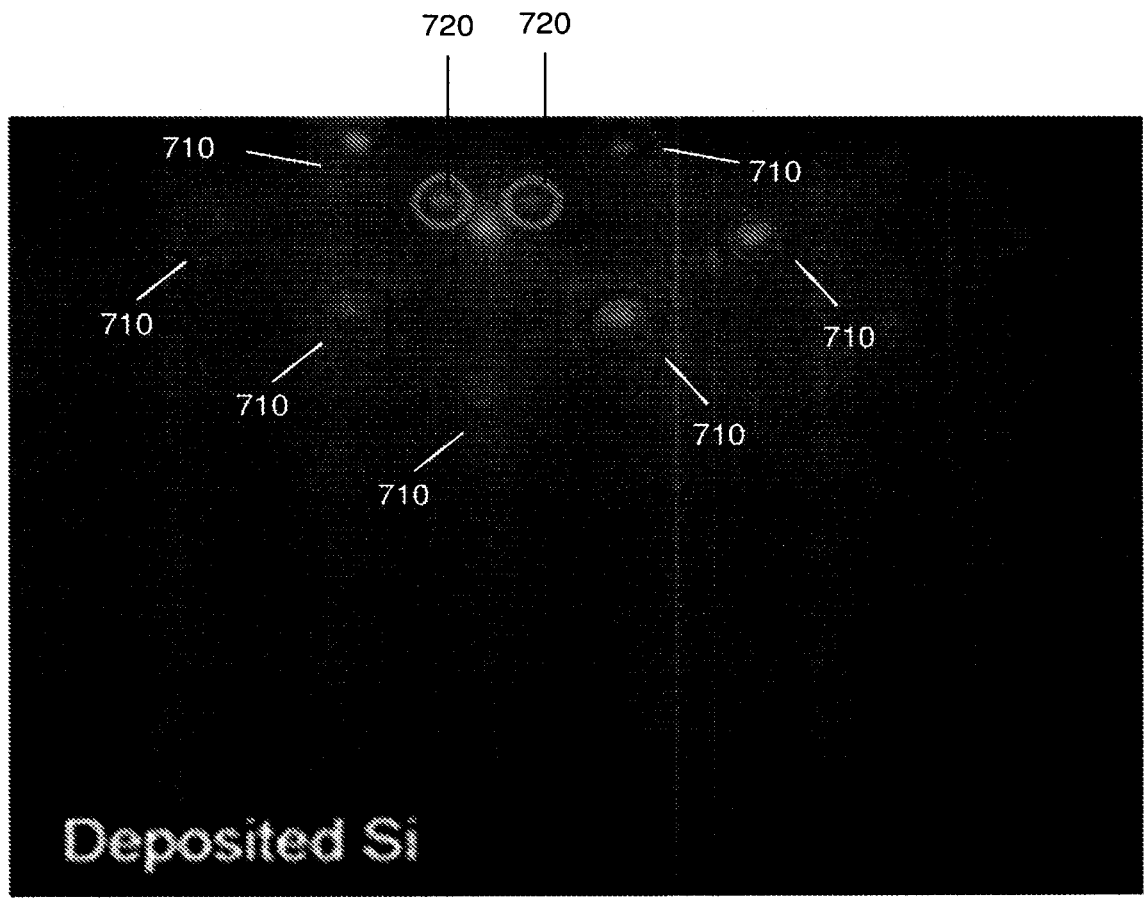
FIG. 7 is RHEED pattern of Si deposited at 875° C. on the surface of a fifty-unit cell LAO film where the large red circles indicate the positions of RHEED spots from the primary crystalline lattice of the Si islands, while the small blue circles indicate the observation of a minor, secondary phase.

Characterization of the deposited Si surface is accomplished via in situ RHEED (FIG. 7). The formation of three-dimensional Si islands on the surface of the deposited LAO film can be observed. The majority phase of the Si islands appears to be commensurate with the underlying LAO lattice, as indicated by the spacing between the primary RHEED spots (circles 710 in FIG. 7). However, a secondary phase is also observed, leading to the formation of weaker spots around the primary spots in the RHEED pattern (circles 720 in FIG. 7).

Figure 8:
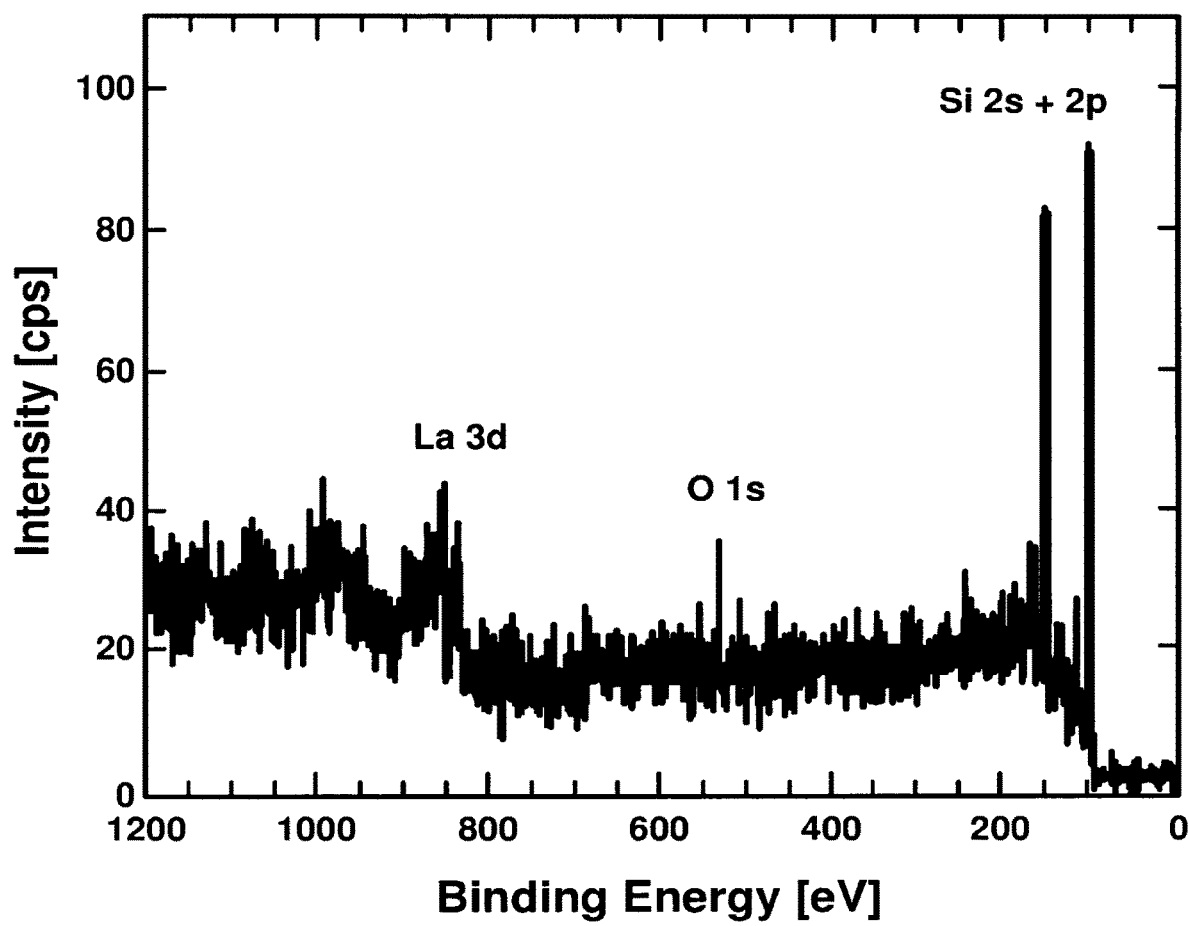
FIG. 8 is survey XPS spectrum of SOS sample showing predominantly Si 2s and 2p core levels, with only small O 1s and La 3d peaks visible in the spectrum.

After Si deposition, the resulting samples can be characterized with in situ XPS. Notably, only a very small O 1s core level peak was observed (FIG. 8), demonstrating minimal surface oxidation of the deposited Si. This is important, as it indicates the deposited Si does not scavenge oxygen from the underlying LAO film. The observed small O 1s core level peak in the XPS spectrum is likely due to the slight oxidation of the deposited Si surface as a result of the small residual background oxygen and water vapor pressure in the MBE and XPS systems.

After removal from the ultra-high vacuum environment, the SOS samples were characterized with scanning transmission electron microscopy (STEM). The cross-section of the layer stack indicates the excellent crystalline quality of the STO and LAO films. This can be clearly seen from the images taken in high-angle annular dark field (HAADF) mode (FIG. 9A). In this imaging mode, the intensity of the atomic columns scales roughly as the square of the atomic number Z. Thus, the LAO columns are the brightest (due to the large atomic mass of La), followed by the STO columns. The Si substrate and the deposited Si are both dim when viewed in this imaging mode owing to silicon's relatively small atomic mass.

Figure 9B:
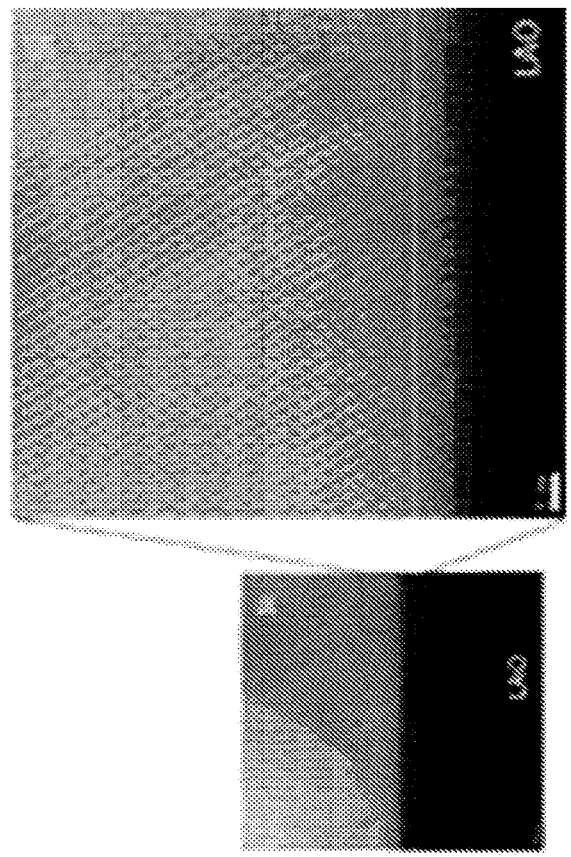
FIG. 9B is a high-resolution image of the LAO/Si interface taken in annular bright field (ABF) imaging mode.
Figure 9A:
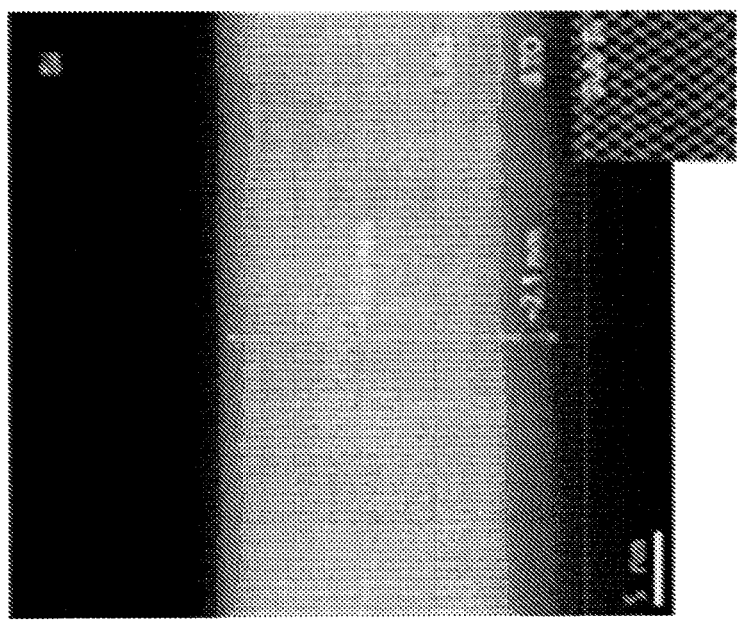
FIG. 9A is a cross-sectional STEM image of a completed SOS sample taken in high-angle annular dark field (HAADF) imaging mode. In this imaging mode, the intensity of the atomic columns scales roughly as the square of the atomic number Z.

When imaged using annular bright field (ABF) mode, the deposited Si layer can be much more clearly resolved (FIG. 9B). From the image in FIG. 9B, evidence of the 3×1 interface reconstruction between LAO and Si can be seen. Furthermore, the image indicates the deposited Si is largely single crystalline, although some stacking faults can be observed along the right-hand side of the image. In order to more directly compare the crystalline nature of the deposited Si with that of the underlying Si substrate, selected area electron diffraction (SAED) has been carried out on the prepared STEM sample.

Figure 10:
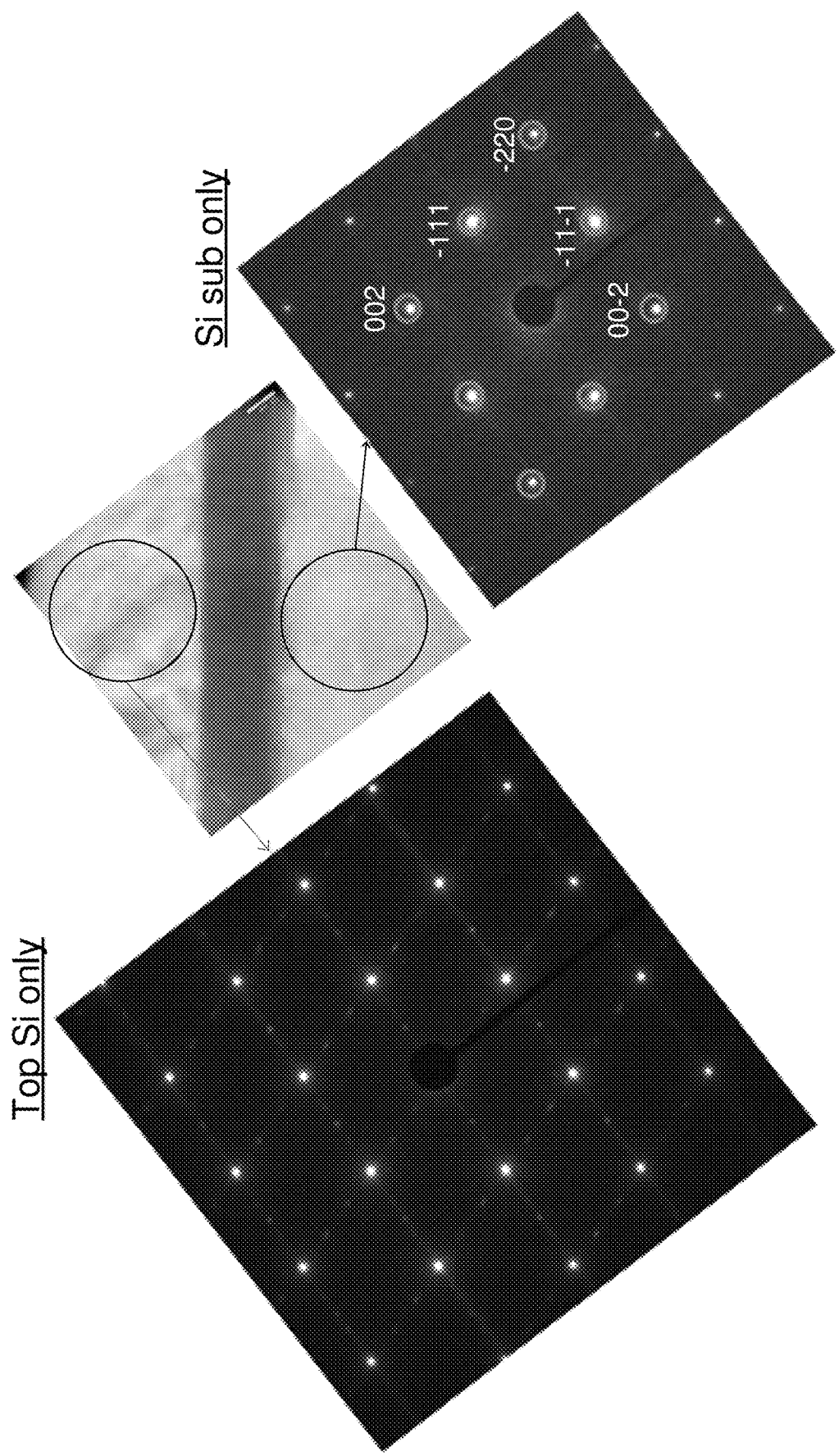
FIG. 10 is a selected area electron diffraction patterns of the Si substrate (right panel) and deposited Si (left panel) with the cross-sectional STEM image indicating the areas of the sample from which the SAED patterns were collected is shown in the center panel.

A comparison between the electron diffraction pattern obtained from the Si substrate and that obtained from the deposited Si (FIG. 10) shows that the two Si layers have predominantly the same crystalline symmetry. However, while the Si substrate displays a single, uniform symmetry in the diffraction analysis, additional spots are observed between major spots in the diffraction pattern of the deposited Si film. These small spots indicate the presence of defects in the deposited Si, such as stacking faults. This observation is consistent with the surface electron diffraction (RHEED) pattern presented in FIG. 7. Despite the presence of a small amount of crystalline defects in the deposited Si, the SAED analysis suggests the experimental results have succeeded in our attempts to integrate silicon (001) on Si-integrated transition metal oxide thin films, resulting in the formation of a silicon-on-oxide-on-silicon (SOS) layer stack.

Insulating Oxide Layer

Pertaining to the insulating oxide layer inserted in between the "$SrTiO_3$ buffer layer" and the "top silicon layer", the insulating oxide layer is not limited to $LaAlO_3$ used to demonstrate the claim. The insulating oxide layer can be any oxide that can be deposited epitaxially on STO that will not allow Si to scavenge oxygen from it and cause the formation of an amorphous $SiO_2$ interlayer. This means that the formation energy for the oxide should be greater than the formation energy for $SiO_2$ per oxygen atom. Additionally, this oxide should have a phase (stable or metastable) that can be reasonably lattice-matched (<5% mismatch) to Si and STO. For binary oxides, these include $ZrO_2$, $HfO_2$, $CeO_2$, $PrO_2$, $BeO$, $MgO$, $\gamma\text{-}Al_2O_3$, $Y_2O_3$, $Sc_2O_3$, and $RE_2O_3$ (where RE is a medium to small rare earth element=Nd, Sm, Eu, Gd, Tb, Dy, Ho, Er, Tm, Yb, Lu). Several ternary oxides will also satisfy the requirements, including: perovskite hafnates/zirconates ($SrZrO_3$, $SrHfO_3$, $CaZrO_3$, $CaHfO_3$, $EuZrO_3$), rare earth scandates ($YScO_3$, $REScO_3$<RE=rare earth element>), large rare earth aluminates ($PrAlO_3$, $NdAlO_3$, $CeAlO_3$), and aluminum spinels ($MgAl_2O_4$, $BeAl_2O_4$).

Technologies and Applications

The novel silicon-on-insulator-on-silicon (SOS) platform used in various embodiments can be used in many potential technological applications, depending in large part on the choice of functional oxide layer. Oxides are progressively finding use in a wide variety of applications, including magnetic sensing, silicon photonics, electronics, and photovoltaics, to name a few. Many of these oxides feature crystalline lattices compatible with that of STO, allowing for their integration into the SOS platform.

One notable area in which functional oxides are currently gaining increased interest is in the field of silicon photonics. In particular, the ferroelectric oxide $BaTiO_3$ (BTO) has garnered significant attention due to its large linear electro-optic response (the so-called Pockels effect). Current state-of-the-art BTO photonic devices employ a wafer-bonding technique, in which BTO is first epitaxially grown on silicon via an STO buffer layer and then bonded to a thermally oxidized silicon wafer via an $Al_2O_3$ bonding layer. This procedure results in crystalline BTO on amorphous $SiO_2$ and offers superior electrical and optical isolation when compared to BTO photonic devices grown directly on traditional SOI. By utilizing various embodiments of the SOS platform, the fabrication of such photonic devices can be simplified significantly.

Figure 11B:
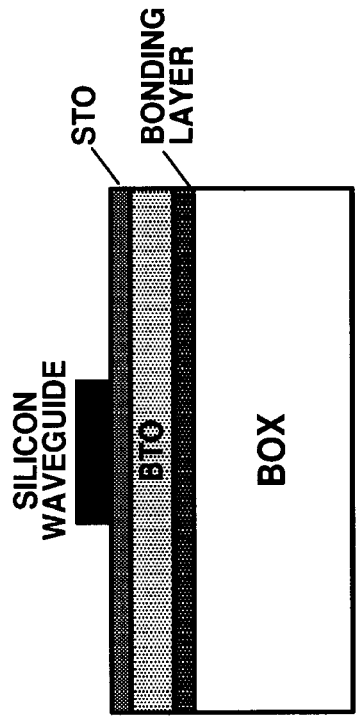
FIGS. 11A-11B illustrate a comparison between BTO-on-$SiO_2$ photonic devices fabricated via the SOS platform (11A) and the wafer-bonding approach (11B).
Figure 11A:
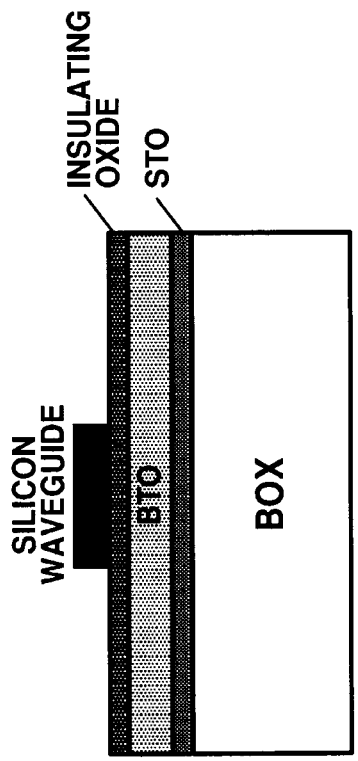

The fabrication concept of hybrid BTO-silicon waveguides using the SOS platform bypasses the difficult and costly wafer-bonding process previously used for the fabrication of such devices by instead relying only on direct epitaxial integration techniques throughout. Critically, devices fabricated using the SOS platform can be distinguished from wafer-bonded devices by the absence of a bonding layer in the final device stack and by the orientation of the STO buffer layer with respect to the silicon waveguide (FIGS. 11A-11B). Additionally, the inclusion of an insulating oxide layer between the silicon waveguide and the functional oxide is not necessary in devices fabricated via the wafer-bonding process and is therefore unlikely to be present in wafer-bonded devices. Note the relative orientation of the STO buffer layer in the two devices, the absence of a bonding layer in the SOS-based device (FIG. 11A) and the absence of an insulating oxide layer in the wafer-bonded device (FIG. 11B).

Figure 2:
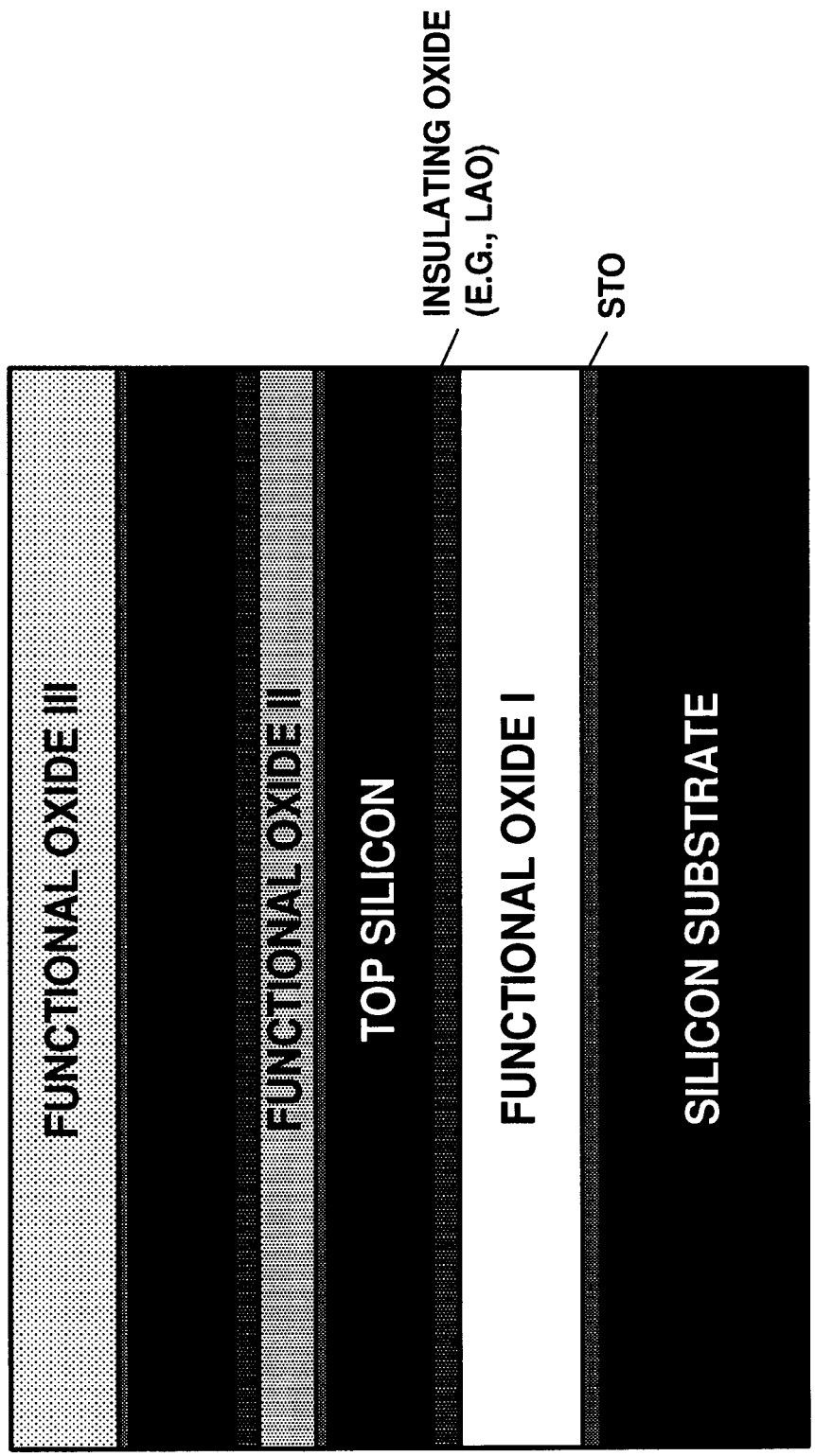
FIG. 2 illustrates a cross-sectional schematic showing the potential to realize multiple layers of functional oxides integrated with silicon within a single platform by repetition of the SOS structure.

The potential to epitaxially integrate an additional STO layer on the top silicon also opens the door for three-dimensional integration of various oxide/silicon devices into a single platform (FIG. 2). Through this procedure, made possible by the SOS platform, complicated oxide/silicon circuitry can be engineered featuring multiple layers of sensors, waveguides, detectors, and many other device types. The potential applications of such technology are numerous owing to the vast array of magnetic, electrical and optical phenomena present in transition metal oxide thin films and heterostructures.

Figure 12:
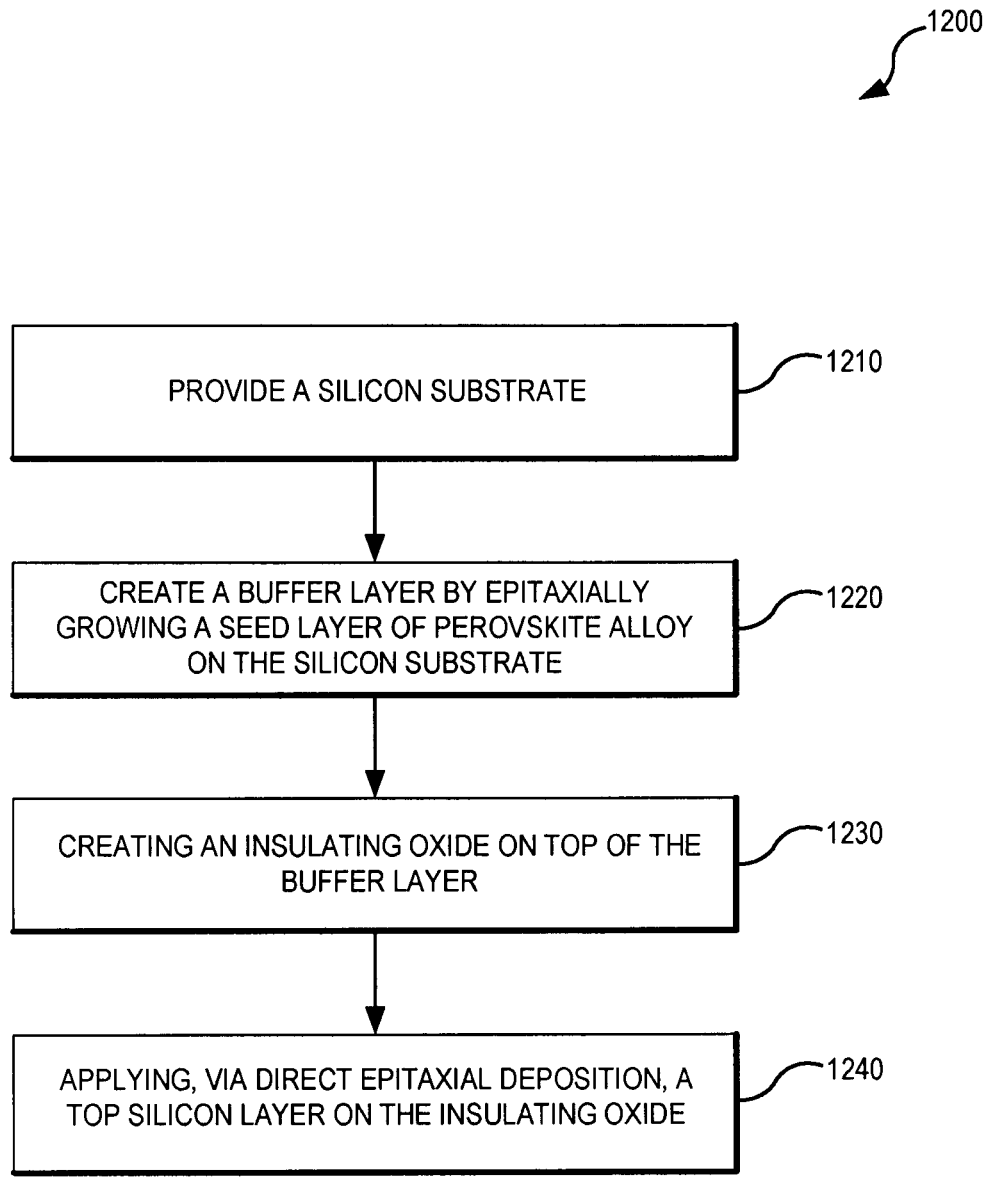
FIG. 12 is a flowchart illustrating a set of operations for manufacturing an SOS structure in accordance with some embodiments of the present technology.

FIG. 12 is a flowchart illustrating a set of operations 1200 for manufacturing an SOS structure in accordance with some embodiments of the present technology. As illustrated in FIG. 12, a silicon substrate can be provided (1210). Then, a buffer layer can be created (1220) by epitaxially growing a seed layer (e.g., a perovskite alloy, strontium titanate (SrTiO3), calcium titanate (CaTiO3), etc.) on the silicon substrate. An insulating oxide (e.g., LAO) can be created (1230) on top of the buffer layer. The insulating oxide may be lattice matched with the buffer layer and does not react with the silicon substrate. A top silicon layer of arbitrary thickness can be applied (1240) (e.g., via direct epitaxial deposition) on the insulating oxide. Alternating depositions of functional oxides and crystalline silicon can be applied in some embodiments (e.g., to create a three-dimensional silicon-oxide-silicon integrated photonic circuit).

In some embodiments, the top silicon layer can be applied on the insulating oxide by using a two-step growth process with an initial Si layer deposited at a first temperature that is higher than a second temperature used during deposition of a second layer. In addition, some embodiments include smoothing a surface of the top silicon layer using chemical-mechanical planarization. Some embodiments may choose the surface composition of LAO to control wetting.

Various embodiments may use different methods of growing LAO. For example, to avoid $SiO_2$ formation below STO, some embodiments grow amorphous LAO (e.g., 1 nm) at low temperature and oxygen pressure, anneal to crystallize then continue normal LAO deposition, or one can start growing immediately while temperature and oxygen pressure are increasing to the LAO growth conditions. Some embodiments may use co-deposition of La/Al. Still yet, some embodiments can use alternating layers of LaO and $AlO_2$ to control surface termination.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A silicon-on-insulator-on-silicon platform comprising:
a silicon substrate;
a buffer layer of strontium titanate ($SrTiO_3$) or calcium titanate ($CaTiO_3$) epitaxially grown on the silicon substrate;
a functional oxide layer formed directly on the buffer layer and underlying a scavenging barrier insulating (SBI) oxide layer;
the SBI oxide layer formed on top of the functional oxide layer; and
a device silicon layer grown via direct epitaxial deposition on the SBI oxide layer, wherein:
the SBI oxide layer comprises:
a formation energy that is greater than a formation energy of silicon dioxide (SiO2) per oxygen atom; and
a phase that allows for lattice matching with the silicon present in the device silicon layer, wherein the lattice matching comprises less than 5% lattice mismatches between the SBI oxide layer and the silicon; and
wherein the SBI oxide layer and the functional oxide layer do not react with either the buffer layer or the device silicon layer.

2. The silicon-on-insulator-on-silicon platform of claim 1, further comprising an alternating arrangement of depositions of the functional oxide layer and the device silicon layer.

3. The silicon-on-insulator-on-silicon platform of claim 2, wherein the alternating arrangement of depositions of the functional oxide layer and the device silicon layer create a three-dimensional silicon-oxide-silicon integrated circuit.

4. The silicon-on-insulator-on-silicon platform of claim 3, wherein the integrated circuit includes an integrated photonic circuit, an integrated electronic circuit, an integrated optoelectronic circuit, or an integrated magneto-optic circuit.

5. The silicon-on-insulator-on-silicon platform of claim 1, wherein the functional oxide layer is ferroelectric or ferromagnetic.

6. The silicon-on-insulator-on-silicon platform of claim 1, wherein the functional oxide layer comprises $BaTiO_3$ or $La_xSr_{1-x}MnO_3$.

7. The silicon-on-insulator-on-silicon platform of claim 1, wherein the SBI oxide layer comprises $LaAlO_3$ (LAO).

8. The silicon-on-insulator-on-silicon platform of claim 1, wherein the silicon substrate is a bulk silicon wafer or a silicon layer on a silicon-on-insulator wafer.

9. A method for producing silicon-on-insulator-on-silicon platforms via direct deposition techniques, the method comprising:
creating a buffer layer by epitaxially growing a seed layer of strontium titanate ($SrTiO_3$) or calcium titanate ($CaTiO_3$) on a silicon substrate;
creating a scavenging barrier insulating (SBI) oxide layer on top of the buffer layer; and
applying, via direct epitaxial deposition, a top silicon layer on the SBI oxide layer, wherein the SBI oxide layer comprises:
a formation energy that is greater than a formation energy of silicon dioxide (SiO2) per oxygen atom; and
a phase that allows for lattice matching with the silicon present in the top silicon layer, wherein the lattice matching comprises less than 5% lattice mismatches between the SBI oxide layer and the silicon.

10. The method of claim 9, wherein applying the top silicon layer on the SBI oxide layer comprises using a two-step growth process with an initial Si layer deposited at a first temperature that is higher than a second temperature used during deposition of a second layer.

11. The method of claim 9, further comprising smoothing a surface of the top silicon layer using chemical-mechanical planarization.

12. The method of claim 9, further comprising applying alternating depositions of functional oxides and crystalline silicon.

13. The method of claim 12, wherein the alternating depositions of the functional oxides and crystalline silicon create a three-dimensional silicon-oxide-silicon integrated circuit.

14. The method of claim 13, wherein the three-dimensional silicon-oxide-silicon integrated circuit includes an integrated photonic circuit, an integrated electronic circuit, an integrated optoelectronic circuit, or an integrated magneto-optic circuit.

15. The method of claim 9, wherein the SBI oxide layer comprises LaAlO$_3$.

16. The method of claim 9, wherein creating the SBI oxide layer on top of the buffer layer comprises growing an epitaxial layer of the SBI oxide layer on top of the buffer layer.

17. The method of claim 9, wherein the SBI oxide layer comprises LAO and the method further comprises:
growing an amorphous 1 nm LAO at a first temperature and oxygen pressure; annealing to crystallize; and continuing normal LAO deposition.

18. The method of claim 9, wherein the SBI oxide layer comprises LAO and the SBI oxide layer is grown while temperature and oxygen pressure are increasing to LAO growth conditions.

19. The method of claim 9, further comprising use of a co-deposition of La/Al or alternating layers of LaO and AlO2 to control surface termination.

20. The method of claim 9, wherein the SBI oxide layer comprises LAO and the method further comprises selecting a surface composition of LAO to control wetting.

21. The method of claim 9, wherein the silicon substrate is a bulk silicon wafer or a silicon layer from a silicon-on-insulator wafer.

22. A method for integrating crystalline silicon atop functional oxides via an epitaxial, insulating scavenging barrier (SBI) oxide layer, the method comprising:
creating a buffer layer by epitaxially growing a seed layer of strontium titanate (SrTiO$_3$) or calcium titanate (CaTiO$_3$) on a silicon substrate;
creating a functional oxide layer directly on the buffer layer and underlying a scavenging barrier insulating (SBI) oxide layer;
creating the SBI oxide layer on top of the functional oxide layer; and
applying, via direct epitaxial deposition, a top silicon layer on the SBI oxide layer,
wherein the SBI oxide layer comprises:
a formation energy that is greater than a formation energy of silicon dioxide (SiO2) per oxygen atom; and
a phase that allows for lattice matching with the silicon present in the top silicon layer, wherein the lattice matching comprises less than 5% lattice mismatches between the SBI oxide layer and the silicon layer.

23. The method of claim 22, wherein the SBI oxide-layer comprises ☐-alumina or LaAlO$_3$.

24. The method of claim 22, wherein the functional oxide layer comprises BaTiO$_3$ or LaSrMnO$_3$.

25. The method of claim 22, wherein the silicon substrate is a bulk silicon wafer or a silicon layer on a silicon-on-insulator wafer.

26. The method of claim 22, wherein the functional oxide layer is ferroelectric, ferromagnetic, elastooptic, magnetoelastic, or piezoelectric.

27. The method of claim 22, wherein the functional oxide layer comprises BaTiO$_3$, La$_x$Sr$_{1-x}$MnO$_3$, or SrMnO$_3$.

28. A silicon-on-insulator-on-silicon platform comprising:
a silicon substrate;
a buffer layer comprising an epitaxial oxide buffer layer epitaxially grown on the silicon substrate;
an insulating oxide layer formed on top of the buffer layer, wherein the insulating oxide layer is a scavenging barrier layer to prevent oxygen scavenging from the buffer layer; and
a device silicon layer grown via direct epitaxial deposition on the insulating oxide layer, wherein the insulating oxide layer comprises:
a formation energy that is greater than a formation energy of silicon dioxide (SiO2) per oxygen atom; and
a phase that allows for lattice matching with the silicon present in the device silicon layer, wherein the lattice matching comprises less than 5% lattice mismatches between the insulating oxide layer and the silicon.

29. The silicon-on-insulator-on-silicon platform of claim 28, wherein the epitaxial oxide buffer layer comprises strontium titanate (SrTiO$_3$) or calcium titanate (CaTiO$_3$).

30. The silicon-on-insulator-on-silicon platform of claim 28, wherein the silicon substrate is a bulk silicon wafer or a silicon layer on a silicon-on-insulator wafer.

* * * * *

UNITED STATES PATENT AND TRADEMARK OFFICE
CERTIFICATE OF CORRECTION

PATENT NO. : 12,471,367 B2  
APPLICATION NO. : 17/436179  
DATED : November 11, 2025  
INVENTOR(S) : Alexander A. Demkov et al.

Page 1 of 1

It is certified that error appears in the above-identified patent and that said Letters Patent is hereby corrected as shown below:

In the Claims

Column 14, Line 6, Claim 23, delete "□-alumina" and insert --γ-alumina--

Signed and Sealed this
Twentieth Day of January, 2026

John A. Squires
*Director of the United States Patent and Trademark Office*